United States Patent [19]

Hollway et al.

[11] 4,032,910

[45] June 28, 1977

[54] MICROWAVE ALARM

[75] Inventors: David Lipscombe Hollway, Gordon; Peter Ivan Somlo, Killarney Heights; John David Hunter, Carlingford; Idris Gareth Morgan, Haberfield, all of Australia

[73] Assignee: Commonwealth Scientific and Industrial Research Organization, Campbell, Australia

[22] Filed: Aug. 5, 1975

[21] Appl. No.: 602,056

[30] Foreign Application Priority Data

Aug. 5, 1974 Australia .......................... 8418/74

[52] U.S. Cl. ............................... 340/224; 325/363
[51] Int. Cl.² ........................................ G08B 21/00
[58] Field of Search ............ 340/224; 325/67, 364, 325/363; 315/134, 150; 250/388, 211 J

[56] References Cited

UNITED STATES PATENTS

| | | | |
|---|---|---|---|
| 3,173,091 | 3/1965 | Strull | 325/364 X |
| 3,828,251 | 8/1974 | Webb | 325/363 X |
| 3,927,375 | 12/1975 | Lanoe et al. | 340/228 R |

Primary Examiner—Alvin H. Waring
Attorney, Agent, or Firm—Sughrue, Rothwell, Mion, Zinn & Macpeak

[57] ABSTRACT

A portable microwave power detector is provided which will generate an alarm signal when placed within a microwave field having a power density above a predetermined limit. The detector comprises a rigid body member, a microwave receiving antenna fixed to or within the body member and, between elements of the antenna itself, a passive non-linear audio and/or visual alarm indicator fixed to or within the body member and connected to the antenna for energization by the microwave power received thereby.

6 Claims, 5 Drawing Figures

MICROWAVE ALARM

This invention is concerned with microwave power detectors and seeks to provide a simple, portable device which will generate an alarm signal when placed within a microwave field having a power density above a predetermined limit.

With the increasing use of high-power microwave equipment in a variety of domestic, industrial, medical and military applications, there is an urgent need for simple, reliable alarms which can be carried or worn by persons who use, service or work near such equipment. Moreover, where government regulations set acceptable limits for the leakage of radiation from microwave devices, such as domestic microwave ovens, there is a need for a cheap foolproof alarm which can be used by untutored persons to check whether there is radiation leakage above the prescribed level.

Accordingly, the present invention provides a microwave alarm device comprising a rigid body member, a microwave receiving antenna fixed to or within said body member so as to prevent substantial relative movement between the body member and said antenna, and between elements of the antenna itself, and, a passive non-linear audio and/or visual alarm indicator fixed to or within the body member and connected to the antenna for energization by the microwave power received thereby; whereby, upon subjecting the device to an increasing microwave field, the alarm indicator is activated by the microwave energy supplied from the antenna to produce a distinct audio or visual alarm signal when the energy of the microwave field increases beyond a predetermined level.

A surprisingly simple and effective alarm can be produced, in accordance with this invention, by using a miniature low-voltage incandescent lamp as the non-linear indicator, the lamp being such that the ratio of the length of the primary filament coils to the length of the filament wire is within the range 0.1 to 0.4. Given such a lamp, it has been found that the normal non-linear voltage-lumen characteristic is enhanced quite dramatically because the impedance match between the filament and the antenna is much better when the filament is hot than when cold. In this way, a sharp transition between a nonalarm dull filament glow and an alarm incandescence can be achieved over a wide range of predetermined field intensity levels.

Nevertheless, such alarm devices may not be unambiguous in the hands of a completely untutored user. They are sensitive to over-load, and they tend to be fragile by virtue of the delicate filament. According to an optional but preferred feature of this invention, therefore, a hot carrier diode is connected across the aerial and a solid-state alarm indicator is employed. The use of a filament lamp indicator with the diode permits a much wider choice of lamp characteristics, but it is not preferred because the alarm condition then becomes more ambiguous since filament-to-antenna matching is no longer a significant variable; moreover, fragility and overload-sensitivity still remain. Therefore, in addition to the hot-carrier diode it is preferable to use, in accordance with the invention, a solid-state trigger circuit to provide an unambiguous transition to the alarm state. (The problem of the relatively fragile filament will still remain, however, if a filament lamp is employed as the alarm signalling device.)

Thus, as suggested above, it is preferred to employ a solid-state alarm indicator in the form of a trigger circuit and a light-emitting diode, but the use of a predominantly solid-state, passive audio alarm is also envisaged. Preferably, then, the trigger circuit includes a silicon-controlled rectifier arranged across the hot carrier diode and in series with the indicator device, the trigger electrode of the controlled rectifier being connected to a voltage (or current) sensitive device arranged to receive at least a portion of the voltage (or current) produced by the hot carrier diode.

It will be appreciated that devices formed in accordance with the present invention can be constructed from a very small number of inherently reliable components, all of which can be mounted on a small rigid body in the form of a card that can be readily worn by those required to work within the vicinity of microwave devices. By combining two or more devices on the same card, the alarm can be made self-checking and discarded when one of the devices ceases to operate.

Having broadly portrayed the nature of the present invention, a number of examples of microwave alarms constructed in accordance with the present invention, will now be described with reference to the accompanying drawings by way of example and illustration only. In the drawings:

FIG. 4 (b) is a representation of the way in which the components of the circuit of FIG. 4 (a) can be mounted on a lapel card.

The microwave alarm chosen as the first example (see FIG. 1) is based on the use of a small low-voltage incandescent lamp. It is suited for use by the operators of industrial or domestic microwave ovens to check whether there is excessive leakage from the oven door seals. Typically, such ovens operate at about 2450 MHz and — when in use — the door seals must not leak more than 5 milliwatts per sq. cm. of microwave power at a distance of 5 cm. from the surface. (as manufactured, the permissable leakage may be as low as 1 milliwatt per sq. cm. at 5 cm.) Hitherto, these checks have had to be made by trained operators with sophisticated instruments.

Now, the use of filament lamps as indicators of high-frequency fields is known, but their application to the microwave band is not, because — as would be expected — the filament's inductive reactance is so high at these frequencies that insufficient current flows to heat the filament to incandescence. A thorough mathematical analysis of the situation conducted by the applicant shows, however, that it should be possible to produce small lamps which would operate satisfactorily.

Figure 2:
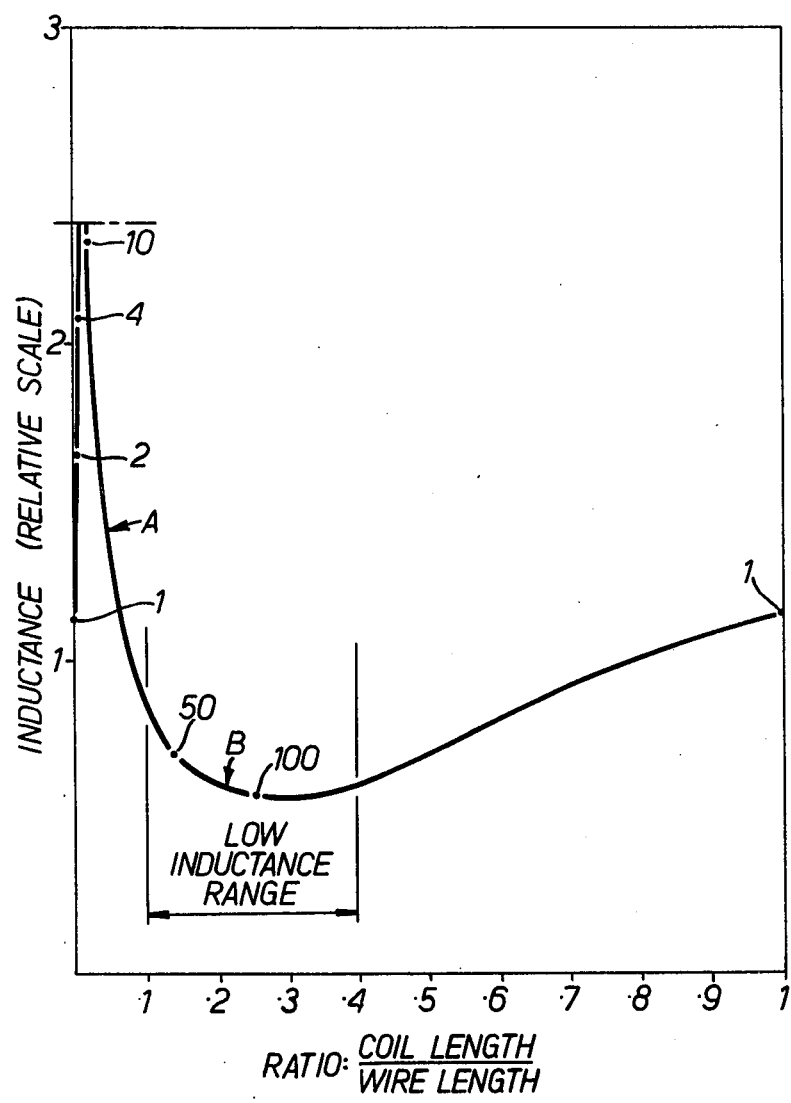
FIG. 2 is a graph showing how the inductance of a coil varies with the turns geometry.

Briefly, it was shown that, if a number of pieces of wire having the same length and diameter are wound into helical coils having different numbers of turns, the coil diameter being reduced as the number of turns is increased, then the inductances of these coils lie on a curve similar to that shown in FIG. 2. The horizontal scale (abscissa) denotes the ratio: coil length/wire length and also denotes, on a non-linear scale, the number of turns starting from a single turn (at the extreme left) and increasing as shown by the numbers circled. For coils longer than about 0.4 of the wire length, the turns become very elongated and the number of turns is less important than the coil length. It is assumed in FIG. 2 that the long coils are shaped into toroids. Therefore when the coil length is equal to the wire length, as at the extreme right of FIG. 2, the coil again becomes a single turn with an inductance equal to that at the extreme left.

It is clearly evident from FIG. 2 that there is a preferred range, marked 'low inductance range', of parameters for winding coils of low inductance and theory and practice show that the use of filaments having shapes in this range, are a practical necessity in constructing incandescent-lamp microwave power alarm indicators for use in the range 10 mW/sq. cm. and below.

On the basis of this analysis, the following prescriptions can be made in order to utilise this unexpected minima in the frequency v. reactance curve:
1. A miniature, low-voltage, (preferably 12 volts or below) incandescent filament lamp should be used, having a rated power dissipation of 100 to 500 mw.
2. The primary filament coil diameter should be such that the ratio of the axial length of the filament coils to the full length of the filament wire comprising the coils should fall within the range 0.1 to 0.4.
3. The full length of the filament wire should be substantially less than one half the wavelength or the radiation concerned; usually the case with miniature filament lamps.
4. The radius of the filament wire should be comparable to the skin depth of electromagnetic radiation of the microwave frequencies; usually the case with miniature filament lamps.

Following these criteria a number of commercially available panel lamps were examined. First, a subminiature "grain of wheat" lamp used in model railways was selected as the superficially most suitable on the basis of size, lead length etc. This lamp has a nominal DC rating of 40 ma at 10v. In spite of the superficial attractiveness of this lamp — and many other miniature lamps examined — for the present purposes, it proved to be quite unsuitable.

Close examination showed the filament to be 3.8 mm long and that it comprised 122, 0.2 mm diameter, turns of 0.015 mm wire. The filament DC resistance was 29 ohms, its inductance was measured to be 115 nH, while the reactance was at least 1700 ohms at 2450 MHz. When microwave energy is applied to lamps of this type, the inductive reactance is generally so large that the filaments cannot reach incandescence. Moreover, the capacitive reactance of the filament leads can cause near resonance conditions and, therefore an even higher impedance.

On the other hand, a larger and therefore superficially less suitable miniature panel lamp made by Taunus (Germany) was found to operate excellently. It had a DC resistance of 16 ohms and a nominal rating of 40 ma. at 6 volts. The filament wire was found to be 0.013 mm in diameter; it was formed into a coiled-coil configuration with the primary coil diameter of 0.06 mm, 160 turns and a length of 3 mm (the diameter of the larger or secondary coil being 0.2 mm). The inductance was measured and found to be 18 nH, and the reactance was 280 ohms.

When microwave power was applied to this lamp, a dull red glow was noticeable at microwave field intensities of between 1 and 4 mw/sq.cm. While the glow certainly grew brighter and more orange in color as the field intensity was increased to near 5 mw/sq.cm., a sudden and noticeable "switch" to incandescence was evident as the power intensity was increased to about 6 mw/sq.cm.

Figure 1:
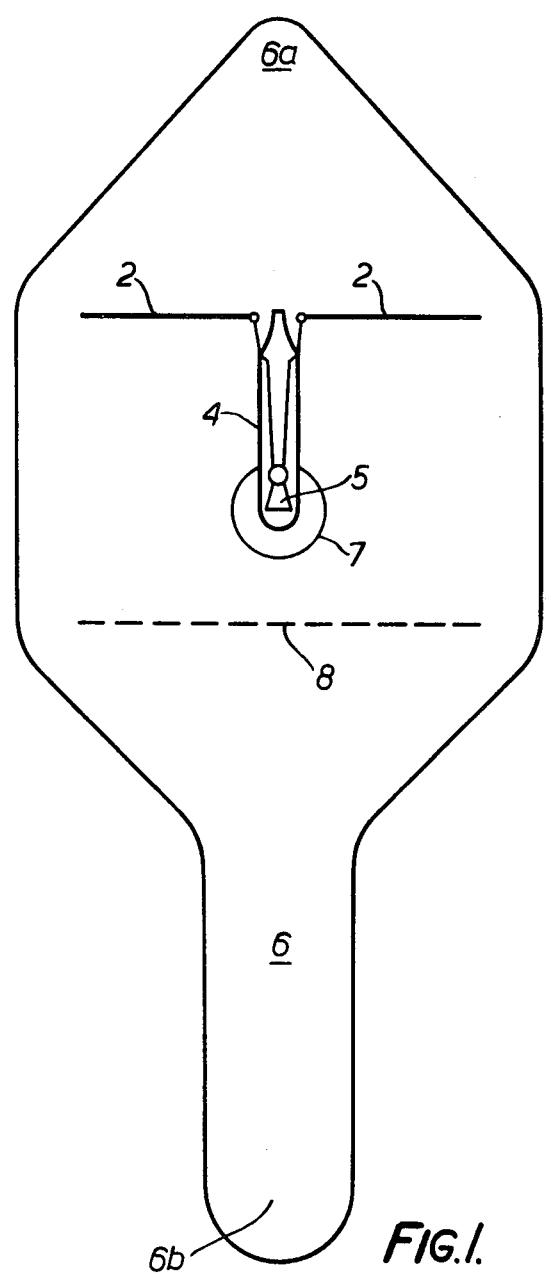
FIG. 1 shows an incandescent lamp microwave alarm for use in connection with domestic and industrial microwave ovens.

Referring specifically to FIG. 1, the microwave alarm of the first chosen embodiment simply consists of a dipole antenna 2 connected to the filament leads of an incandescent lamp 4, one of the second type of lamps identified above. Both the dipole elements and the lamp are firmly sandwiched between two layers of a flat card mount 6, which is provided with a window 7, through which the filament of globe 4 can be viewed. Card 6 not only prevents the elements of the dipole aerial 2 and the lamp 4 from moving with respect to one another, but it also facilitates proper positioning of the alarm device in relation to a microwave oven. This is achieved by virtue of a forward extension 6a having a front face which is 5 cm from the dipole antenna 2 and a rear handle portion 6b. (In the version shown, the arms of the dipole are aligned in the plane of the flat mount, but to make the device less sensitive to polarization effects, the arms may be arranged perpendicular to one another, the card mount also being of angular section.)

The microwave alarm is simply presented to the oven in the vicinity of the door seal until projection 6a contacts the surface of the oven, the device being then rotated about the axis of the lamp and handle 6b while the glow, if any, from the lamp filament is observed. With a suitable choice of lamp and length of dipole antenna, a dull red glow will be observed from the filament when the device is used to test a normal commercial microwave oven that is not leaking excessively. This has the advantage of firstly confirming that the filament is intact, and secondly, allowing the device to be rotated until the glow is maximized. An excessive power leakage is, of course, indicated by an incandescent glow from the lamp filament. (The "setting" of the alarm can be adjusted by altering the length of the projection 6a, the length of the diphole antenna and the choice of the filament characteristics; also as shown by dotted lines, one or more thin metallic strips 8 may be incorporated in the card 6 as reflector elements for the antenna to increase the gain thereof).

Figure 3:
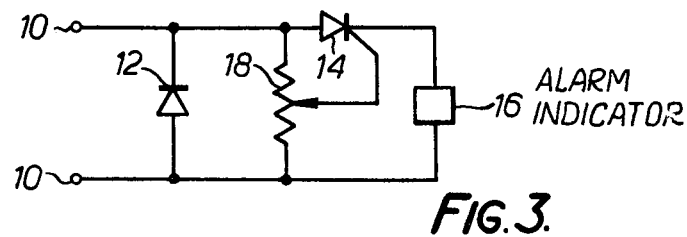
FIG. 3 is a schematic circuit diagram showing a triggered alarm.

FIG. 3 is a generalised diagram of one form of solid-state alarm envisaged by the invention. The alarm indicator circuit is connected to a suitable antenna (not shown) via terminals 10, across which a hot carrier diode 12 is arranged. A silicon-controlled rectifier 14 is connected in series with an audio or visual alarm indicator 16 across diode 12, and is triggered by a signal level derived from a potential divider 18 also connected across the diode 12. The alarm indicator 16 may be a light emitter, such as a light emitting diode, or it can be a sound emitter, such as the "mini-sonalert" manufactured by P. R. Mallory & Co. Inc. Indiannapolis Indianna, (U.S.A.).

Figure 4A:
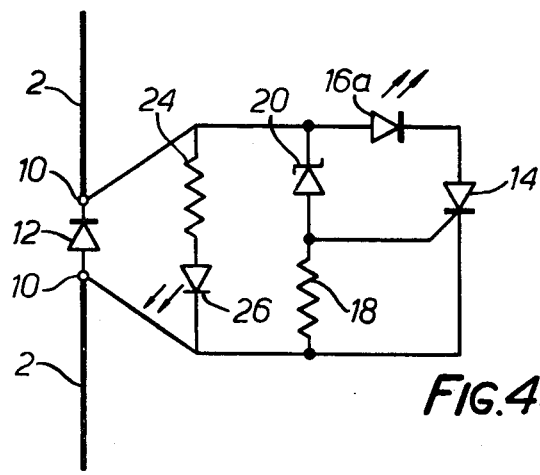
FIG. 4 (a) is a schematic circuit diagram of another form of triggered alarm incorporating a zener diode.
Figure 4B:
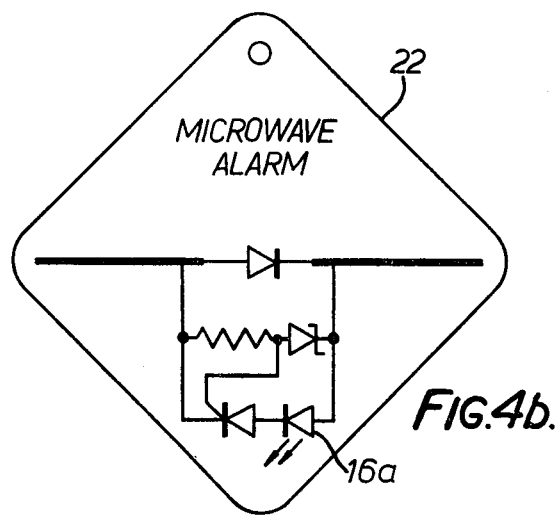

The embodiment shown in FIG. 4a is similar to that of FIG. 3 except that one half of the potential divider 18 is formed by a zener diode 20, and the indicator consists of a light-emitting-diode 16a. A further modification to the basic circuit of FIG. 3 may be effected (see FIG. 4a) by the addition of a resistor 24 and a second LED 26 in series across hot-carrier diode 12 (as shown by dotted lines); LED 26 emitting light of a different color (say, green,) to LED 16a (which is preferably red). FIG. 4(b) shows the alarm device of FIG. 4(a) as it might be arranged upon a lapel card 22 designed to be pinned to the lapel of a person who works close to microwave equipment.

In operation, an increase in the microwave field intensity results in an increase in the detection voltage across the diode 12, until a level is reached where the voltage (or current) level applied to the controlled rectifier 14 causes it to switch on and energize the indicator 16 (or 16a). In the devices of FIG. 4, the suddenness of transition of the alarm state is enhanced by the use of the low-voltage zener diode 20. The LED 16a indicates the alarm conditions when activated, but the LED 26 (when employed) simply confirms that the hot-carrier diode is functioning properly.

It will be appreciated by those skilled in the art, that simple, reliable and convenient microwave alarm devices have been made available by the present invention. However, it will also be appreciated that a number of modifications and alterations are possible without departing from the scope of the invention. For example, helical antennae may be used in place of dipoles and will offer some advantages in certain configurations of the alarm; also, a flip-flop (or other bi-stable electronic circuit) may be used to switch on the alarm indicator instead of an SCR. These and other modifications will be apparent to those skilled in the art.

The claims defining the invention are as follows:

1. A microwave alarm device comprising:
   a. a rigid body member,
   b. a microwave receiving antenna secured to said body member to prevent relative movement between the body member and said antenna, and between elements of the antenna itself, and
   c. a non-linear alarm indicator secured to the body member and connected to the antenna or energization by microwave power received thereby, said non-linear alarm indicator comprising a hot carrier diode connected across the antenna, a trigger circuit connected across the hot carrier diode and comprising a silicon controlled rectifier and a potential divider circuit connected to the control electrode of the rectifier and across the hot carrier diode, and a passive indicator device connected to said trigger circuit for activation thereby to produce a distinct alarm signal at a predetermined signal level delivered by the diode and antenna combination.

2. A microwave alarm device according to claim 1, wherein the potential divider circuit comprises a zener diode connected in series with a resistor across the hot carrier diode, and wherein the junction of the zener diode and resistor is connected to the control electrode of the silicon controlled rectifier.

3. A microwave alarm device according to claim 1, wherein a second passive indicator device in series with a resistor is connected across the hot carrier diode to provide an indication of the functioning of the hot-carrier diode and antenna combination at microwave radiation intensities below that at which the alarm indicator is activated.

4. A microwave alarm device according to claim 2, wherein a second passive indicator device in series with a resistor is connected across the hot carrier diode to provide an indication of the functioning of the hot-carrier diode and antenna combination at microwave radiation intensities below that at which the alarm indicator is activated.

5. A microwave alarm device comprising:
   a. a rigid body member,
   b. a microwave receiving antenna secured to said body member to prevent relative movement between the body member and said antenna, and between elements of the antenna itself, and
   c. a non-linear alarm indicator secured to the body member and connected to the antenna for energization by microwave power received thereby, said non-linear alarm indicator comprising a hot carrier diode connected across the antenna, a trigger circuit connected across the hot carrier diode, and a passive indicator device connected to said trigger circuit for activation thereby to produce a distinct alarm signal at a predetermined signal level delivered by the diode and antenna combination.

6. A microwave alarm device comprising: a rigid body member, a microwave receiving antenna secured to said body member to prevent relative movement between the body member and said antenna, and between elements of the antenna itself, and a passive, non-linear alarm indicator secured to the body member and connected to the antenna for energization by microwave power received thereby; said non-linear alarm indicator comprising a miniature filament lamp connected directly to the antenna, wherein the filament wire of the lamp is wound in coils such that the ratio of the coil length to the length of the wire comprising the coils is within the range 0.1 to 0.4, the lamp having a nominal DC rating of 12 volts or less and 100 to 500m. watt, wherein, upon subjecting the device to a microwave field of increasing intensity, the alarm indicator is activated by the microwave energy supplied from the antenna to produce a distinct visual alarm signal when the energy of the microwave field exceeds a predetermined level.

* * * * *